US012660234B2

(12) United States Patent
Pandey et al.

(10) Patent No.: US 12,660,234 B2
(45) Date of Patent: Jun. 16, 2026

(54) DEVICE WITH WORKFUNCTION METAL IN DRIFT REGION

(71) Applicant: GlobalFoundries U.S. Inc., Malta, NY (US)

(72) Inventors: Shesh Mani Pandey, Saratoga Springs, NY (US); Rajendran Krishnasamy, Essex Junction, VT (US); Chung Foong Tan, Ballston Spa, NY (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 523 days.

(21) Appl. No.: 18/111,995

(22) Filed: Feb. 21, 2023

(65) Prior Publication Data

US 2024/0282853 A1 Aug. 22, 2024

(51) Int. Cl.
| | |
|---|---|
| H10D 30/60 | (2025.01) |
| H10D 30/01 | (2025.01) |
| H10D 62/10 | (2025.01) |
| H10D 64/66 | (2025.01) |

(52) U.S. Cl.
CPC ....... H10D 30/605 (2025.01); H10D 30/0221 (2025.01); H10D 30/603 (2025.01); H10D 30/608 (2025.01); H10D 62/116 (2025.01); H10D 64/667 (2025.01); H10D 64/671 (2025.01)

(58) Field of Classification Search
CPC ............. H10D 30/0221; H10D 30/603; H10D 30/608; H10D 30/0289; H10D 30/658; H10D 62/116; H10D 64/671; H10D 64/027; H10D 64/513; H10D 64/516; H10D 64/675
See application file for complete search history.

(56) References Cited

U.S. PATENT DOCUMENTS

| | | | |
|---|---|---|---|
| 8,174,071 | B2 | 5/2012 | Tien et al. |
| 8,716,791 | B1 | 5/2014 | Iravani et al. |
| 8,987,813 | B2 | 3/2015 | Lee et al. |
| 10,910,478 | B1 | 2/2021 | Xu |
| 11,342,453 | B2 | 5/2022 | Shen et al. |
| 2009/0273026 | A1 | 11/2009 | Wilson et al. |
| 2009/0273029 | A1 | 11/2009 | Tien et al. |

(Continued)

FOREIGN PATENT DOCUMENTS

| | | |
|---|---|---|
| CN | 112909095 | 6/2021 |

OTHER PUBLICATIONS

The Extended European Search Report and Opinion dated Jul. 12, 2024 in EP Application No. 24152278.8-1211, 10 pages.

(Continued)

*Primary Examiner* — Yu Chen
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to a device with workfunction metal in a drift region and methods of manufacture. The structure includes: a gate structure having at least a first workfunction metal in a channel region and a second workfunction metal, which is different from the first workfunction metal, in a trench in a drift region; and a sidewall spacer adjacent to the gate structure within the trench in the drift region.

19 Claims, 4 Drawing Sheets

(56)          References Cited

U.S. PATENT DOCUMENTS

| | | | | |
|---|---|---|---|---|
| 2010/0237412 A1* | 9/2010 | Shrivastava | ......... | H10D 62/116 |
| | | | | 257/E29.256 |
| 2012/0094457 A1 | 4/2012 | Gabrys | | |
| 2012/0248528 A1 | 10/2012 | Wilson et al. | | |
| 2014/0042527 A1* | 2/2014 | Lee | ...................... | H10D 64/513 |
| | | | | 257/330 |
| 2016/0211348 A1 | 7/2016 | Yoshida | | |
| 2016/0240663 A1* | 8/2016 | Tu | ........................ | H10D 64/027 |
| 2017/0365602 A1 | 12/2017 | Zhou | | |
| 2022/0005952 A1 | 1/2022 | Signh et al. | | |
| 2022/0059691 A1* | 2/2022 | Shen | ...................... | H10D 30/65 |
| 2023/0223437 A1* | 7/2023 | Tailor | .................. | H10D 64/513 |
| | | | | 257/330 |

OTHER PUBLICATIONS

Yue Hu et al., "Numerical investigation on L-shaped vertical field plate in high-voltage LDMOS", https://doi.org/10.1016/j.rinp.2019. 102547, Results in Physics, vol. 15, 2019, 102547, ISSN 2211-3797, 6 pages.
Specification and Drawings filed on Jul. 20, 2022 in U.S. Appl. No. 17/872,360, 25 pages, Considered spec and drawings only.

* cited by examiner

DEVICE WITH WORKFUNCTION METAL IN DRIFT REGION

BACKGROUND

The present disclosure relates to semiconductor structures and, more particularly, to a device with workfunction metal in a drift region and methods of manufacture.

A laterally-diffused metal-oxide semiconductor (LD-MOS) is a planar double-diffused MOSFET (metal-oxide-semiconductor field-effect transistor) used in amplifiers, including microwave power amplifiers, RF power amplifiers and audio power amplifiers. These transistors are often fabricated on p/p⁺ silicon epitaxial layers. The fabrication of LDMOS devices mostly involves various ion-implantation and subsequent annealing cycles. As an example, the drift region of a power MOSFET is fabricated using up to three ion implantation sequences in order to achieve the appropriate doping profile needed to withstand high electric fields.

The silicon-based RF LDMOS (radio-frequency LDMOS) is a widely used RF power amplifier in mobile networks, enabling the majority of the world's cellular voice and data traffic. LDMOS devices are widely used in RF power amplifiers for base-stations as the requirement is for high output power with a corresponding drain to source breakdown voltage usually above 60 volts. Compared to other devices such as GaAs FETs, RF LDMOS show a lower maximum power gain frequency.

SUMMARY

In an aspect of the disclosure, a structure comprises: a gate structure comprising at least a first workfunction metal in a channel region and a second workfunction metal, which is different from the first workfunction metal, in a trench in a drift region; and a sidewall spacer adjacent to the gate structure within the trench in the drift region.

In an aspect of the disclosure, a structure comprises: a drift region within semiconductor substrate; a trench in the drift region; a gate structure comprising a first workfunction metal in a channel region outside of the trench and a second workfunction metal in the trench in the drift region; and a sidewall spacer in the drift region between the second workfunction metal a drain region of the gate structure.

In an aspect of the disclosure, a method comprises: forming a drift region within a semiconductor substrate; forming a trench within the drift region; forming a gate structure partly within the trench and partly outside of the trench, the gate structure comprising a channel region of a first workfunction metal, and a second workfunction metal formed within the trench in the drift region, the second workfunction metal being different than the first workfunction metal; and forming a sidewall spacer adjacent to the gate structure in the drift region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a device with workfunction metal in a drift region and methods of manufacture. In more specific embodiments, the device comprises a laterally-diffused metal-oxide semiconductor (LDMOS) with a workfunction metal in a trench in the drift region. Advantageously, the workfunction metal in the trench in the drift region improves drain-source breakdown Voltage (BVDSS) and Ron, and reduces leakage.

In embodiments, the LDMOS includes a gate structure having a first portion on a semiconductor substrate and a second gate portion in a trench in a drift region within the semiconductor substrate. The first portion comprises, e.g., n-type workfunction material, and the second portion in the trench includes, e.g., p-type workfunction material. Accordingly, the gate structure includes a n-type workfunction material in a channel region, with a high-k dielectric material and a p-type workfunction material in a trench in the drift region. A sidewall spacer, e.g., insulator material, is provided within the trench between the gate electrode and a drain region.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
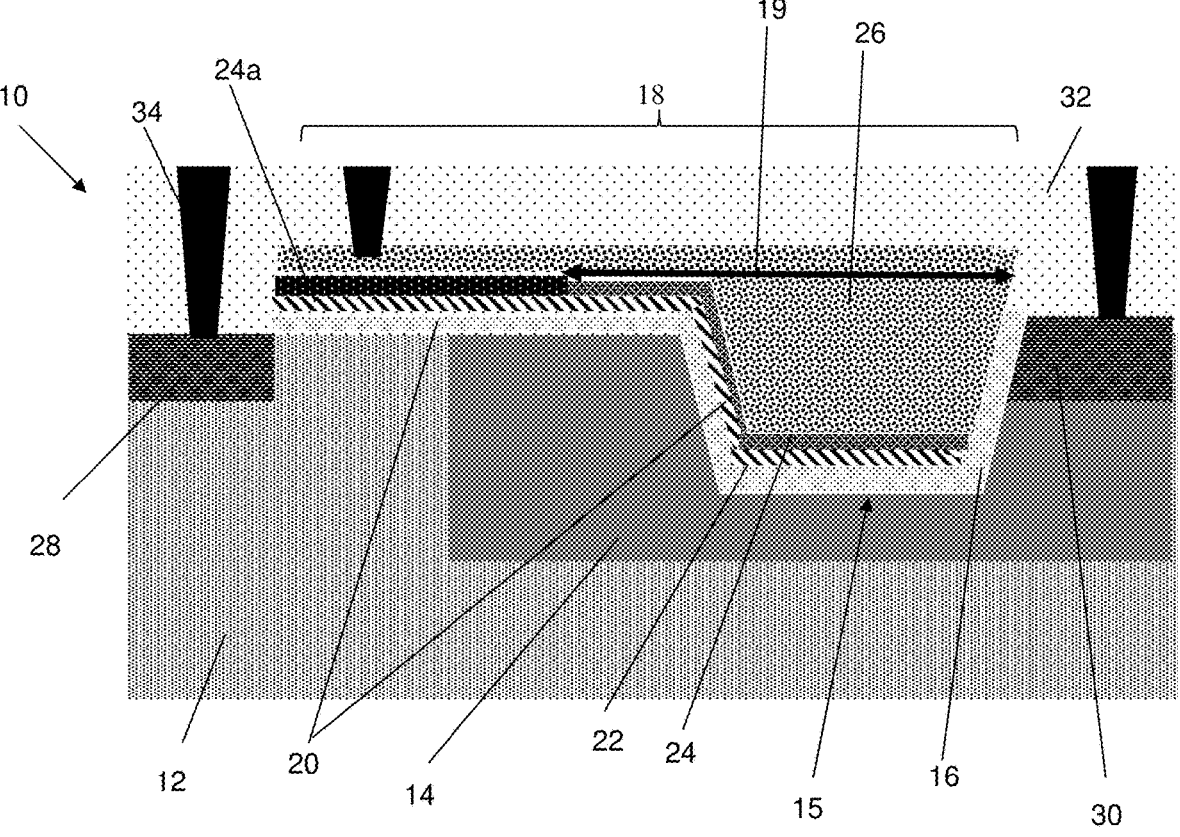
FIG. 1 shows an LDMOS structure and respective fabrication processes in accordance with aspects of the present disclosure.

FIG. 1 shows an LDMOS structure and respective fabrication processes in accordance with aspects of the present disclosure. More specifically, the LDMOS structure 10 includes a semiconductor substrate 12 composed of any suitable material including, but not limited to, Si, SiGe, SiGeC, SiC, GaAs, InAs, InP, and other III/V or II/VI compound semiconductors. In preferred embodiments, the semiconductor substrate 12 may be p⁺ doped Si material.

A well implant 14 may be provided within the semiconductor substrate 12. In embodiments, the well implant 14 may be a drift region for a drain region of the device. The well implant 14 may preferably be an N-well implant region, e.g., comprising arsenic dopant. As described in more detail with respect to FIG. 3A, the well implant 14 may be formed by a conventional ion implantation process that introduces a concentration of n-type dopant into the semiconductor substrate 12.

Still referring to FIG. 1, a sidewall spacer 16 may be formed within a trench 15 of the semiconductor substrate 12. As described with respect to FIGS. 3A and 3B, the sidewall spacer 16 may be fabricated by first forming a shallow trench isolation structure in the semiconductor substrate 12 using conventional lithography, etching and deposition processes, followed by a patterning process of the shallow trench isolation structure to form the trench 15, itself. In embodiments, the insulator material of the sidewall spacer 16 may be a low-k dielectric material, e.g., $SiO_2$, which acts as a sidewall spacer to a gate structure 18. Also, depending on the embodiment, the trench formed to fabricate the shallow trench isolation structure may, e.g., have tapered sidewalls or vertical sidewalls.

FIG. 1 further shows the gate structure 18 formed partially within the trench 15 of the semiconductor substrate 12. The gate structure 18 may also be formed partially over a surface of the semiconductor substrate 12, adjacent to and outside of the trench 15 as described in more detail with respect to FIGS. 3C-3D. By recessing the gate structure 18 into the trench 15, it is possible to increase the surface area of the gate structure 18. Also, the portion of the gate structure 18 within the trench 15 will have a surface in close proximity to the drift region, e.g., well implant 14, which helps in the accumulation of charge in the drift region, e.g., well implant 14. In this way, the device can handle higher current with a low breakdown voltage at the junction of the drift region and the gate structure 18.

In embodiments, the gate structure 18 may include a low-k dielectric material 20 formed on the exposed sidewall and bottom of the trench 15, adjacent to and contacting the sidewall spacer 16. In addition, the low-k dielectric material 20 may extend on a surface of the well implant 14 and semiconductor substrate 12, adjacent to the trench 15. The low-k dielectric material 20 may also be formed on the sidewall spacer 16, which effectively makes the sidewall spacer 16 thicker. The low-k dielectric material 20 may be the same material as the insulator material, e.g., low-k dielectric material, used to form the sidewall spacer 16.

The gate structure 18 also includes a high-k dielectric material 22 provided over the low-k dielectric material 20, partially within the trench 15 and extending outside the trench 15. In embodiments, the high-k dielectric material 22 may be at a bottom surface and sidewall of the trench 15, which is opposite to the sidewall spacer 16. The high-k dielectric material 22 may be a hafnium based material; although other high-k dielectric materials are also contemplated herein. More specifically, the high-k dielectric material 22 may be, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Still referring to FIG. 1, a p-type workfunction metal 24 may be formed over the high-k dielectric material 22. As with the high-k dielectric material 22, the p-type workfunction metal 24 may extend over a bottom and sidewall of the trench 15, opposite to the sidewall spacer 16. The p-type workfunction metal 24 may also extend outside of the trench 15 partially over the high-k dielectric material 22. In embodiments, the p-type workfunction metal 24 may include, e.g., Ti, TiAlC, Al, TiAl, TaN, TaAlC, TiN, TiC and Co.

An n-type workfunction metal 24a may be provided adjacent to and in contact with the p-type workfunction metal 24, on the exposed portion of the high-k dielectric material 22 outside of the trench 15. The n-type workfunction metal 24a may extend to over the well implant 14, and may be any n-type workfunction metal such as, e.g., TiN, TaN, TaAlC, TiC, TiAl, TaC, Co, Al, TiAl, HfTi, TiSi, TaSi or TiAlC; although other workfunction metals are contemplated herein. The n-type workfunction metal 24a may be used to moderate the electric field of the gate structure 18.

In embodiments, the n-type workfunction metal 24a may be in a channel region of the gate structure 18; whereas the p-type workfunction metal 24 and the high-k dielectric material 22 may be in the drift region 19.

A gate material 26, e.g., gate electrode, may be formed over the p-type workfunction metal 24 in the trench 15 and the n-type workfunction metal 24a outside of the trench 15. In embodiments, the gate material 16 may be polysilicon material or a workfunction material. In the case of a polysilicon material, the high-k gate dielectric material may be eliminated. Examples of workfunction materials may include W, Ti, TiAlC, Al, TiAl, TaN, TiN, TiC, Co, TaC, HfTi, TiSi or TaSi.

Still referring to FIG. 1, a source region 28 and a drain region 30 may be formed in the semiconductor substrate 12 using conventional ion implantation processes with, for example, N+ type dopants. In embodiments, the drain region 30 is provided within the well implant 14, e.g., drift region, which is separated from the gate structure 18 by the sidewall spacer 16 on the sidewall of the trench 15. In embodiments and as should be understood by those of skill in the art, the drift region 19 is provided in the well implant 14 defined between the edge of the n-type workfunction metal 24a and the drain region 30. In embodiments, the trench 15 is provided within the drift region 19. The source region 28 may be formed within the semiconductor substrate 12, adjacent to the gate structure 18.

An interlevel dielectric material 32 may be formed over the gate structure 18 and exposed portions of the semiconductor substrate 12, e.g., over the source region 28 and the drain region 30. In embodiments, the interlevel dielectric material 32 may comprise a combination of nitride and/or oxide based materials, e.g., SiN and $SiO_2$, deposited using conventional deposition processes, e.g., chemical vapor deposition (CVD). Vias or trenches may be formed within the interlevel dielectric material 32 to expose the source region 28, drain region 30 and gate structure 18. The vias or trenches may be formed using conventional lithography and etching processes as described herein such that no further explanation is required for a complete understanding of the present disclosure.

The exposed surfaces of the source region 28 and drain region 30 undergo a silicide process to form silicide contacts on the exposed semiconductor material of the source region 28 and drain region 30. In the configuration in which the gate structure 18 comprises polysilicon material, a silicide process can also be performed through the via which exposes the gate structure 18. It should be understood by those of skill in the art that silicide contacts will not be required on a gate structure 18 which comprises workfunction metals.

As should be understood by those of skill in the art, the silicide process begins with deposition of a thin transition metal layer, e.g., nickel, cobalt or titanium, over fully formed and patterned semiconductor material. After deposition of the material, the structure is heated allowing the transition metal to react with exposed silicon (or other semiconductor material as described herein) in the active regions of the semiconductor device, e.g., the source region 28 and drain region 30 and, in some embodiments, the gate structure 18 which comprises polysilicon, forming a low-resistance transition metal silicide. Following the reaction, any remaining transition metal is removed by chemical etching, leaving silicide contacts in the active regions of the device.

Contacts 34 are formed within the vias or trenches of the interlevel dielectric material 32, connecting to the source region 28, drain region 30 and the gate structure 18. In more specific embodiments, the contacts 34 land on the silicide contacts of the source region 28 and drain region 30 and, in embodiments, the gate structure 18. The contacts 34 may be tungsten, for example, lined with TaN or TiN. The contacts 34 may be deposited using a conventional deposition process, e.g., CVD, followed by a CMP process to remove any excessive material on the surface of the interlevel dielectric material 32.

Figure 2:
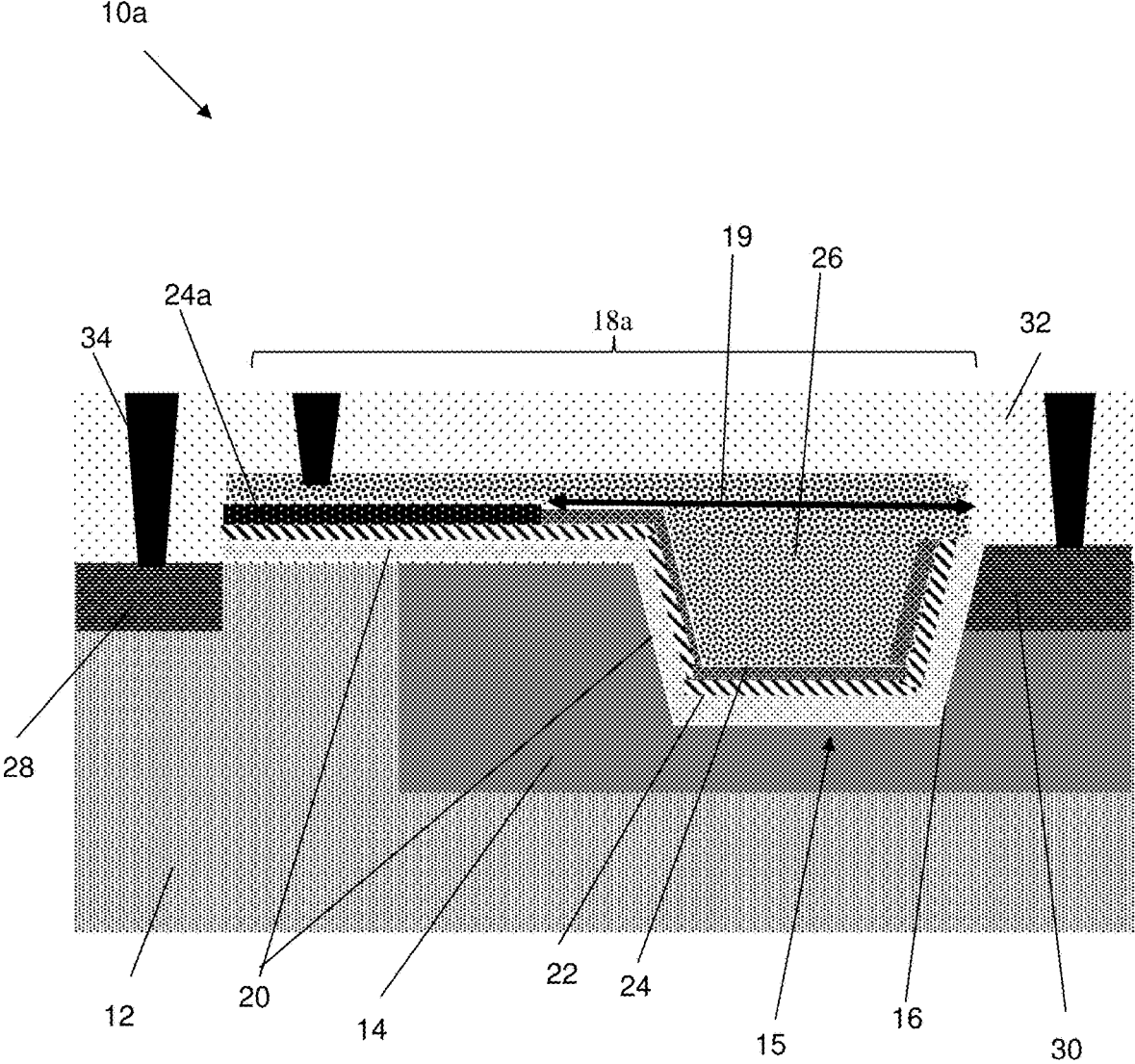
FIG. 2 shows an LDMOS structure in accordance with additional aspects of the present disclosure.

FIG. 2 shows an LDMOS structure in accordance with additional aspects of the present disclosure. More specifically, the LDMOS structure 10a of FIG. 2 shows a gate structure 18a with the high-k dielectric material 22 and the p-type workfunction material 24 extending along both sidewalls of the trench 15. For example, in embodiments, the high-k dielectric material 22 and the p-type workfunction material 24 extend over the sidewall spacer 16 and the low-k dielectric material 20. As in either embodiment, the sidewalls of the gate structure 18 may either be vertical or tapered, depending on the patterning of the trench 15. The remaining features of the structure 10a are similar to the structure 10 of FIG. 1 such that no further explanation is required for a complete understanding of the present disclosure.

FIGS. 3A-3D show processing steps for the fabrication of the LDMOS structure shown in FIG. 1. It should be understood by those of ordinary skill in the art that similar processes can be used to manufacture the structures shown in FIG. 2.

Figure 3A:
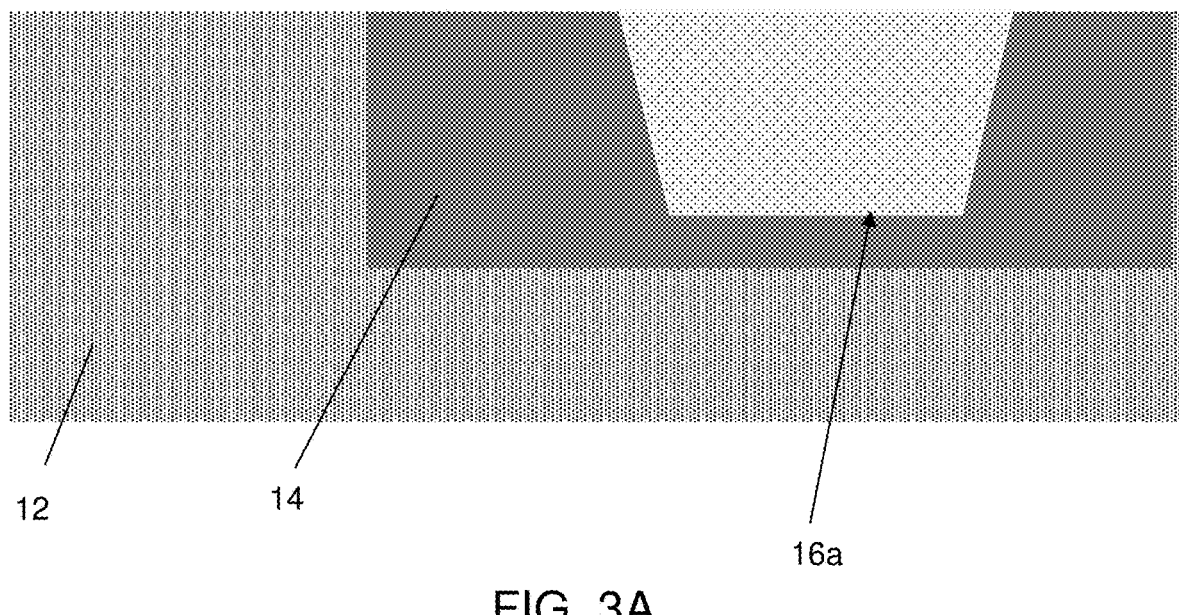
FIGS. 3A-3D show processing steps for the fabrication of the LDMOS structure shown in FIG. 1 in accordance with aspects of the present disclosure.

In FIG. 3A, the N-well 14 may be formed within the semiconductor substrate 12 by an ion implantation process. By way of example, the N-well 14 may be formed by introducing a concentration of an N-type dopant in the semiconductor substrate 12 using a patterned implantation mask to define selected areas exposed for the implantation as is known in the art. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The N-well 14 may be doped with n-type dopants, e.g., Arsenic (As), Phosphorus (P) and Antimony (Sb), among other suitable examples at different concentrations. An annealing process may be used to diffuse the dopant into the semiconductor substrate 12.

Still referring to FIG. 3A, a shallow trench isolation structure 16a may be formed in the semiconductor substrate 12 and, more preferably, within the N-well 14. In embodiments, the shallow trench isolation structure 16a can be formed by conventional lithography, etching and deposition methods known to those of skill in the art. For example, a resist formed over the semiconductor substrate 12 is exposed to energy (light) and developed to form a pattern (opening). An etching process with a selective chemistry, e.g., reactive ion etching (RIE), will be used to transfer the pattern from the resist layer to the semiconductor substrate 12 to form a trench in the semiconductor substrate 12, e.g., in the N-well 14. Following the resist removal by a conventional oxygen ashing process or other known stripants, insulator material (e.g., SiO$_2$) can be deposited by any conventional deposition process, e.g., CVD processes. Any residual material on the surface of the semiconductor substrate 12 can be removed by conventional chemical mechanical polishing (CMP) processes.

Figure 3B:
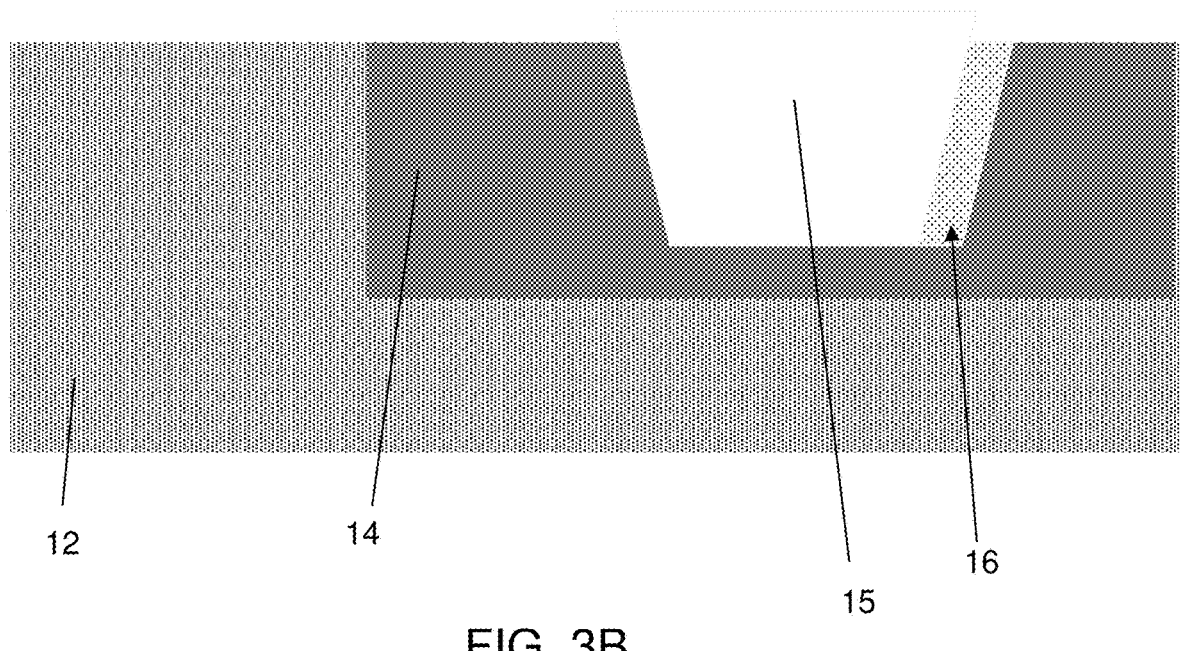

FIG. 3B shows formation of the trench 15 within the shallow trench isolation structure 16a (e.g., within the semiconductor substrate 12). The trench 15 can be formed by a conventional lithography and etching methods known to those of skill in the art with a patterned resist. In this fabrication step, the pattern of the resist is offset from the shallow trench isolation structure 16a to form the trench 15, leaving behind the sidewall spacer 16 on a sidewall (on a drain side of the device).

Figure 3C:
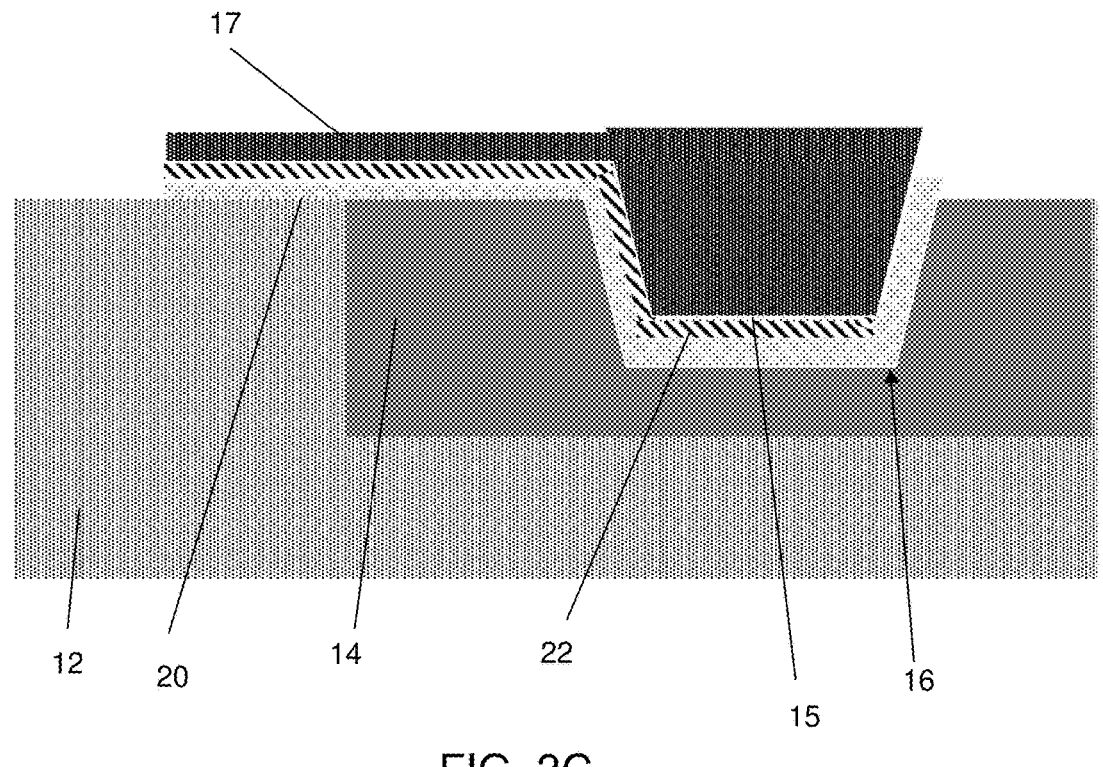

In FIG. 3C, an insulator material 20, e.g., low-k dielectric material, is blanket deposited over the sidewall spacer 16 and exposed regions of the semiconductor substrate 12, both within and outside of the trench 15. In this way, the insulator material 20 will be deposited on the sidewall and bottom of the trench 15. In this embodiment, the insulator material 20 may be blanket deposited by, e.g., chemical vapor deposition (CVD). The insulator material 20 may be patterned using conventional lithography and etching processes.

Still referring to FIG. 3C, a high-k dielectric material 22 may be deposited over the insulator material 20 within and outside of the trench 15. In embodiments, the high-k dielectric material 22 may be deposited by any conventional deposition method including, e.g., plasma enhanced CVD (PECVD) or atomic layer deposition (ALD), as examples. The high-k dielectric material 22 may be patterned to remove this material from the sidewall spacer 16 and to expose the source and drain regions 28, 30 of the semiconductor substrate 12. In the embodiment of FIG. 2, for example, the high-k dielectric material 22 may be patterned to remain on the sidewall spacer 16 and to expose the semiconductor substrate 12 for subsequent formation of the source and drain regions. A sacrificial polysilicon material 17 may be deposited over the high-k dielectric material 22 using any conventional deposition method including, e.g., CVD, followed by a patterning process (lithography and etching) to expose the source and drain regions of the semiconductor substrate 12.

Figure 3D:
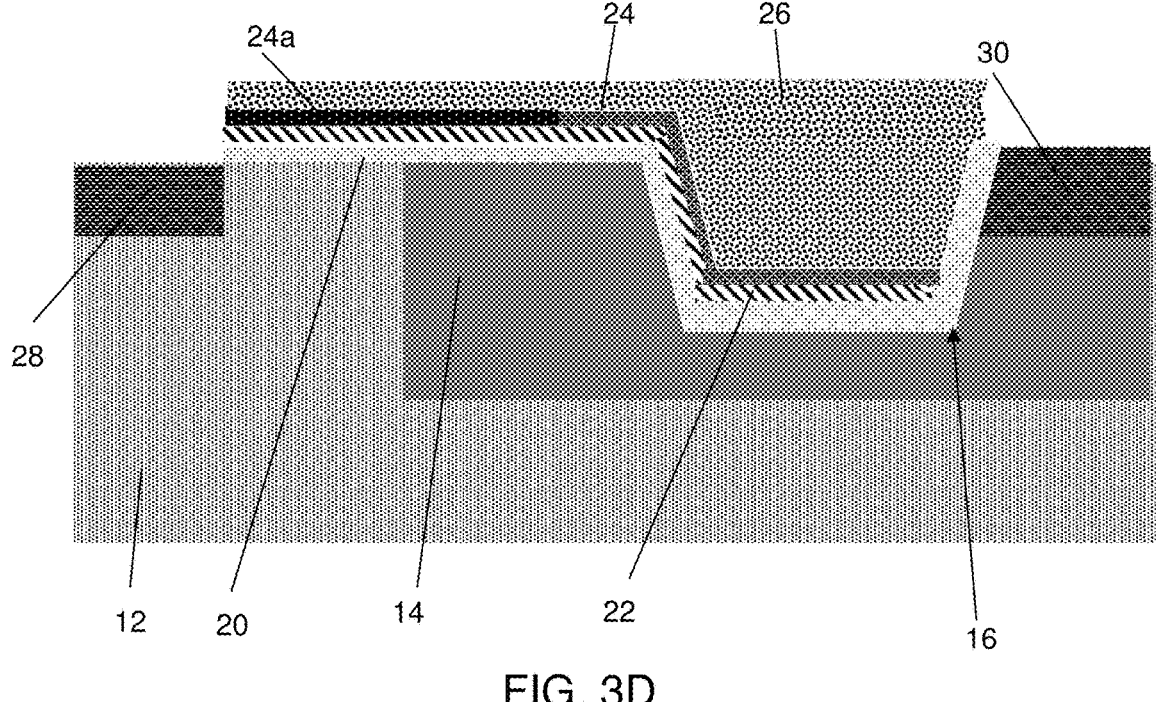

In FIG. 3D, the source region 28 and drain region 30 are formed using conventional ion implantation processes with, for example, N+ type dopants on the exposed portion of the semiconductor substrate 12 adjacent to the recessed shallow trench isolation structure, e.g., trench 15. The drain region 30 is provided within the N-well 14, e.g., drift region, which is separated from the gate structure by the sidewall spacer 16 on the sidewall of the trench 15. In embodiments, the patterned polysilicon material 17 may be used as an ion implantation mask.

Still referring to FIG. 3D, the polysilicon material may be stripped using conventional etching process, and a p-type workfunction metal 24 may be deposited over the high-k dielectric material 22. As with the high-k dielectric material 22, the p-type workfunction metal 24 may be provided within and outside of the trench 15. In embodiments, the p-type workfunction metal 24 may be deposited by any conventional deposition method including, e.g., PECVD or ALD, as examples. In this example, the high-k dielectric material 22 may be subjected to a conventional patterning process as described already herein, resulting in the pattern shown in FIG. 3D.

The n-type workfunction metal 24a may be formed, e.g., deposited and patterned, adjacent and in contact with the p-type workfunction metal 24 on a portion of the high-k dielectric material 22, outside of the trench 15. The n-type workfunction metal 24a may be deposited by any conventional deposition method including, e.g., PECVD or ALD, as examples.

As further shown in FIG. 3D, the gate material 26, e.g., gate electrode, may be formed over the p-type workfunction metal 24 within the trench 15 over the p-type workfunction material 24 and outside of the trench 15 over the n-type workfunction metal 24*a*. In embodiments, the gate material 26 may be tungsten or other workfunction metal or a polysilicon material, any of which may be deposited by a conventional deposition method, e.g., CVD. The gate material 26 may also be subjected to a conventional patterning process to form the pattern shown in FIG. 3D.

Referring back to FIG. 1, the interlevel dielectric material 32 may be formed over the gate structure 18 by blanket deposition processes, e.g., CVD. Vias or trenches may be formed within the interlevel dielectric material 26 to expose the source region 28, drain region 30 and the gate material 26, which are then subjected to a silicide process. The vias or trenches may be formed using conventional lithography and etching processes as described herein. The contacts 34 are formed in the vias or trenches using conventional deposition methods, followed by a planarization process, e.g., CMP.

The LDMOS can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
   a gate structure comprising at least a first workfunction metal in a channel region, a second workfunction metal in a trench in a drift region, and a gate electrode in the channel region above the first workfunction metal and in the trench above the second workfunction metal, wherein the second work function metal is a different workfunction metal from the first workfunction metal, wherein the gate electrode is a same gate material above the first workfunction metal and the second workfunction metal; and
   a sidewall spacer adjacent to the gate structure within the trench in the drift region,
   wherein the sidewall spacer is directly in contact with a top surface of an N-well in a semiconductor substrate and is directly in contact with a sidewall of a drain region.
2. The structure of claim 1, wherein the drift region comprises the N-well, between the first workfunction metal and the drain region, and an end sidewall of the first workfunction metal directly contacts an end sidewall of the second workfunction metal.
3. The structure of claim 1, wherein the first workfunction metal comprises an n-type workfunction metal and the second workfunction metal comprises a p-type workfunction metal.
4. The structure of claim 3, wherein the first workfunction metal is outside of the trench and extends over the N-well in the semiconductor substrate, and the first workfunction metal comprises titanium.
5. The structure of claim 4, wherein the sidewall spacer is on a sidewall of the trench.
6. The structure of claim 1, further comprising an insulator material in the trench, under the gate structure and extending from the sidewall spacer.
7. The structure of claim 1, wherein the gate structure further comprises a high-k dielectric material under the second workfunction metal within the trench, and the second workfunction metal comprises tungsten.
8. The structure of claim 7, wherein the second workfunction metal and the high-k dielectric material extend over the sidewall spacer and an insulator material in the trench.
9. The structure of claim 7, wherein the second workfunction metal and the high-k dielectric material extend over an insulator material and do not extend over the sidewall spacer in the trench.
10. A structure comprising:
   a drift region within semiconductor substrate;
   a trench in the drift region;
   a gate structure comprising a first workfunction metal in a channel region outside of the trench, a second workfunction metal in the trench in the drift region, and a gate electrode in the channel region above the first workfunction metal and in the trench above the second workfunction metal, wherein the second work function metal is a different workfunction metal from the first workfunction metal, wherein the gate electrode is a same gate material above the first workfunction metal and the second workfunction metal; and
   a sidewall spacer in the drift region between the second workfunction metal of the gate structure and a drain region,
   wherein the sidewall spacer is directly in contact with a top surface of an N-well and is directly in contact with a sidewall of the drain region.
11. The structure of claim 10, wherein the drift region comprises the N-well within the semiconductor substrate, and an end sidewall of the first workfunction metal directly contacts an end sidewall of the second workfunction metal.
12. The structure of claim 10, wherein the first workfunction metal comprises an n-type workfunction metal and the second workfunction metal comprises a p-type workfunction metal in the trench.

13. The structure of claim 12, wherein the drift region extends from an edge of the n-type workfunction metal to the drain region, and the first workfunction metal comprises titanium.

14. The structure of claim 10, wherein the sidewall spacer is on a sidewall of the trench in the drift region.

15. The structure of claim 10, wherein the drift region comprises the N-well.

16. The structure of claim 10, further comprising an insulator material in the trench, under the gate structure and extending from the sidewall spacer.

17. The structure of claim 10, wherein the gate structure further comprises a high-k dielectric material under the second workfunction metal within the trench and the second workfunction metal and the high-k dielectric material extend over the sidewall spacer and an insulator material in the trench.

18. The structure of claim 10, wherein the gate structure further comprises a high-k dielectric material under the second workfunction metal within the trench and the second workfunction metal and the high-k dielectric material extend over an insulator material and do not extend over the sidewall spacer in the trench, and the second workfunction metal comprises tungsten.

10

19. A method comprising:

forming a drift region within a semiconductor substrate;

forming a trench within the drift region;

forming a gate structure partly within the trench and partly outside of the trench, the gate structure comprising a channel region of a first workfunction metal, a second workfunction metal formed within the trench in the drift region, and a gate electrode in the channel region above the first workfunction metal and in the trench above the second workfunction metal, wherein the second workfunction metal is a different workfunction metal from the first workfunction metal, wherein the gate electrode is a same gate material above the first workfunction metal and the second workfunction metal; and forming a sidewall spacer adjacent to the gate structure in the drift region, wherein the sidewall spacer is directly in contact with a top surface of an N-well in the semiconductor substrate and is directly in contact with a sidewall of a drain region.

* * * * *